United States Patent [19]

Ohmi et al.

[11] Patent Number: 5,362,672
[45] Date of Patent: Nov. 8, 1994

[54] METHOD OF FORMING A MONOCRYSTALLINE FILM HAVING A CLOSED LOOP STEP PORTION ON THE SUBSTRATE

[75] Inventors: Tadahiro Ohmi, 1-17-301, Komegabukuro 2-chome, Aobu-ku, Sendai-shi, Miyagi-ken 980; Tadashi Shibata, Sendai; Masaru Umeda, Tokyo, all of Japan

[73] Assignee: Tadahiro Ohmi, Miyagi, Japan

[21] Appl. No.: 465,175

[22] PCT Filed: Jun. 15, 1989

[86] PCT No.: PCT/JP89/00599
§ 371 Date: Feb. 1, 1990
§ 102(e) Date: Feb. 1, 1990

[87] PCT Pub. No.: WO89/12908
PCT Pub. Date: Dec. 28, 1989

[30] Foreign Application Priority Data
Jun. 17, 1988 [JP] Japan .................. 63-150581

[51] Int. Cl.$^5$ ............................................ H01L 21/20
[52] U.S. Cl. ...................................... 437/89; 437/113; 148/DIG. 158; 204/192.25
[58] Field of Search ............... 437/21, 4, 113, 89, 437/936, 99; 148/DIG. 158, DIG. 152; 204/192.24–192.25, 192.17, 192.12, 192.3; 427/62; 156/600–602, 610, 620.72

[56] References Cited

U.S. PATENT DOCUMENTS

| | | | |
|---|---|---|---|
| Re. 30,505 | 2/1981 | Jacob | 204/192.25 |
| 3,271,286 | 9/1966 | Lepselter | 148/DIG. 158 |
| 3,385,731 | 5/1968 | Weimer | 204/192.25 |
| 4,042,447 | 8/1977 | Reitz | 204/192.25 |
| 4,043,888 | 8/1977 | Gavaler | 204/192.24 |
| 4,057,476 | 11/1977 | Krikorian et al. | 437/170 |
| 4,279,969 | 7/1981 | Francavilla et al. | 204/192.24 |
| 4,336,118 | 6/1982 | Patten et al. | 204/192.3 |
| 4,412,902 | 11/1983 | Michikami et al. | 204/192.24 |
| 4,525,262 | 6/1985 | Class et al. | 204/192.12 |
| 4,659,401 | 4/1987 | Reif et al. | 204/192.25 |
| 4,732,659 | 3/1988 | Schachter et al. | 204/192.25 |
| 4,761,300 | 8/1988 | Schachter et al. | 204/192.25 |
| 4,795,529 | 1/1989 | Kawasaki et al. | 204/192.25 |
| 4,874,493 | 11/1989 | Pan | 204/192.3 |

FOREIGN PATENT DOCUMENTS

| | | |
|---|---|---|
| 0031731 | 7/1981 | European Pat. Off. ....... 204/192.25 |
| 54-62776 | 5/1979 | Japan . |
| 58-140111 | 8/1983 | Japan . |
| 59-18196 | 1/1984 | Japan . |
| 59-501562 | 8/1984 | Japan . |
| 0039819 | 9/1985 | Japan .................. 148/DIG. 158 |
| 3138710 | 6/1988 | Japan ................ 204/192.24 |
| 63-170299 | 7/1988 | Japan . |
| 2111534 | 11/1982 | United Kingdom ........... 204/192.25 |
| WO8707651 | 12/1987 | WIPO . |

OTHER PUBLICATIONS

Wolf et al., "Silicon processing for the VLSI Era", Lattice Press, Calif., 1986, vol. 1, pp. 358–369.
Publication entitled "Very-Low-Temperature Epitaxial Silicon Growth by Low-Kinetic-Energy Particle Bombardment" from the Extended Abstracts of the 20th Conference on Solid State Devices and Materials, pp. 49–52 (date unknown).
Supplemental European Search Report.

*Primary Examiner*—Olik Chaudhuri
*Assistant Examiner*—H. Jey Tsai
*Attorney, Agent, or Firm*—Baker & Daniels

[57] ABSTRACT

A method of manufacturing a semiconductor device, and particularly a method of forming a monocrystalline film on a substrate. The method includes the step of forming a conductor layer having a step portion on the surface of a substrate. The step portion includes a lateral face which surrounds the lower surface of the step portion to form a closed loop. After the conductor layer has been formed on the surface of the substrate, a monocrystalline film is formed directly on the substrate. Specifically, the film is formed on the lower surface of the step portion, while a DC potential is applied to the conductor layer.

11 Claims, 10 Drawing Sheets

METHOD OF FORMING A MONOCRYSTALLINE FILM HAVING A CLOSED LOOP STEP PORTION ON THE SUBSTRATE

DETAILED DESCRIPTION OF THE INVENTION

The present invention relates to a method to manufacture a semiconductor device, and particularly to a technique to form a thin film semiconductor element on a substrate.

In the past, various techniques have been developed to form a crystal layer of semiconductor on the insulating substrate and to form various types of devices on it. Particularly, the technique to form monocrystal silicon layer on the insulator substrate and to form a semiconductor device on it to produce the integrated circuit is called SOI (Silicon on Insulator), and fervent research and development have been performed for it. If SOI technique can be actualized, it is not only advantageous for the production of the high-speed ICs, but it will open the road toward the latch-up free CMOS circuit or toward a dynamic memory with very high soft error tolerance. Also, it may be possible to achieve IC of 3-dimensional structure by sequentially stacking up the semiconductor elements through the insulating layer on the semiconductor element.

Further, if monocrystal silicon layer can be built up at low cost on the glass substrate with large area by SOI technique, it is possible to provide a high-performance large-size flat panel type display unit. This will bring forth radical innovation to the display devices such as the wall-hanging type television set. Despite of such great expectations, SOI technique is still far from the practical application, and the development of the products based on such technique may not be actualized in near future.

In the following, the problems will be described by giving some examples on SOI technique.

SOS (Silicon on Sapphire) technique is a technique known since many years. This is a technique to form Si thin film on sapphire ($Al_2O_3$) by epitaxial growth and to form IC. Despite of practical application and commercial production since many years, this did not constitute the main stream of SOI technique and is applied only in limited application fields because the product cost of sapphire substrate is higher than silicon wafer and because crystal defect occurs due to the difference of lattice constants of crystal between sapphire and silicon and it is difficult to produce a high-performance device.

Figure 12:
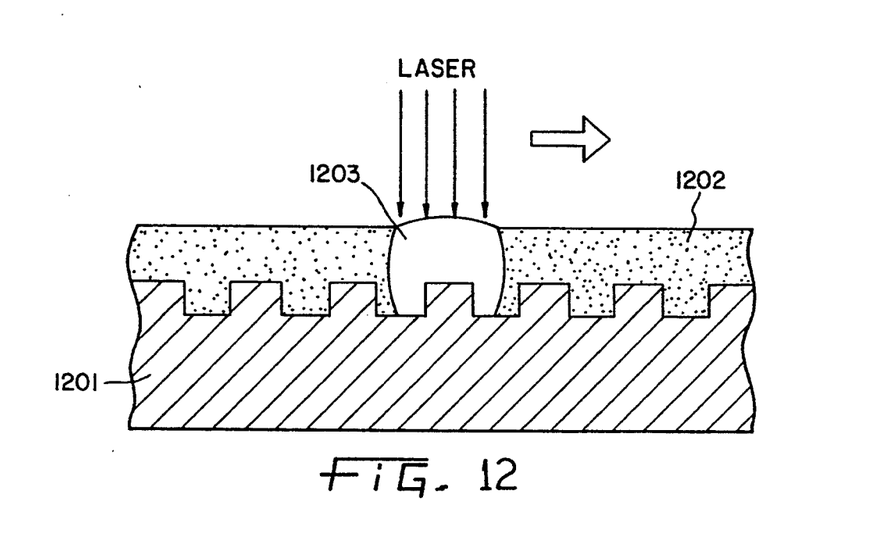
FIG. 12 is a sectional view showing the grapho-epitaxy technique.

In contrast, new techniques have emerged in these 10 years, by which monocrystal silicon thin film is formed on the insulator substrate surface with no crystal property such as $SiO_2$, $Si_3N_4$, AlN, etc. The technique of grapho-epitaxy is one of such new techniques. As shown in FIG. 12, grooves are formed periodically on the surface of $SiO_2$ substrate 1201, and amorphous silicon 1202 silicon 1202 is stacked on it. Then, laser beam is applied by scanning the substrate to produce a partially melted region 1203, and silicon is turned to monocrystal by it. Once silicon is melted, the grating pattern is formed on the surface of the substrate during recrystallization. The crystals aligned to the direction of this pattern are grown, and all surfaces are turned to monocrystal. However, the crystal layers formed by this technique contain many crystal defects and could not be utilized for SOI devices.

Figure 13:
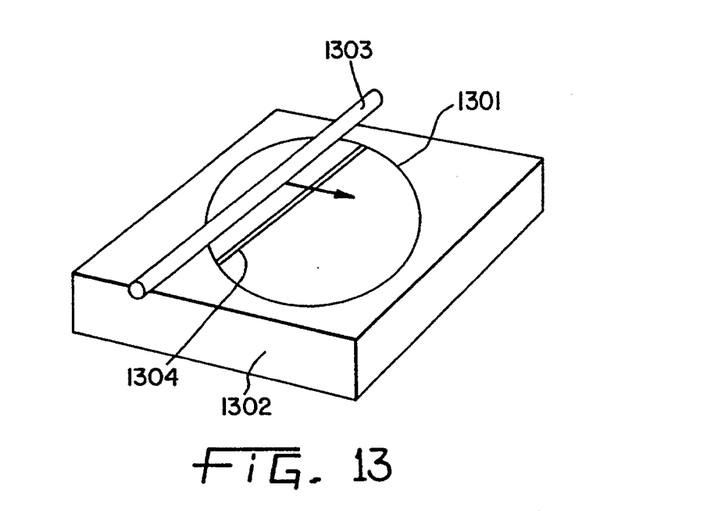
FIG. 13 is a perspective view of the zone melt method.

In the meantime, the zone melt method as shown in FIG. 13 has been developed. In this method, the same wafer 1301 as in FIG. 12 is placed on the stage 1302 and heated. By energizing and scanning with long carbon heater 1303, a linear melted region 1304 is formed on wafer surface to produce monocrystal thin film. By this method, however, good crystal cannot be obtained because of the contamination of carbon from the carbon heater 1303. The wafer may be warped by heat or Si thin film may be cracked, and the method was not practically used. The temperature of wafer is partially increased to more than the melting point (1412° C.) of silicon and this method cannot be applied for 3-dimensional IC. The devices built up on base material may be melted by heat during monocrystallization of the upper silicon layer, or the extreme deterioration of the characteristics may occur.

Electron beam may be used as the heating means, but the results are not very satisfactory.

Figure 14:
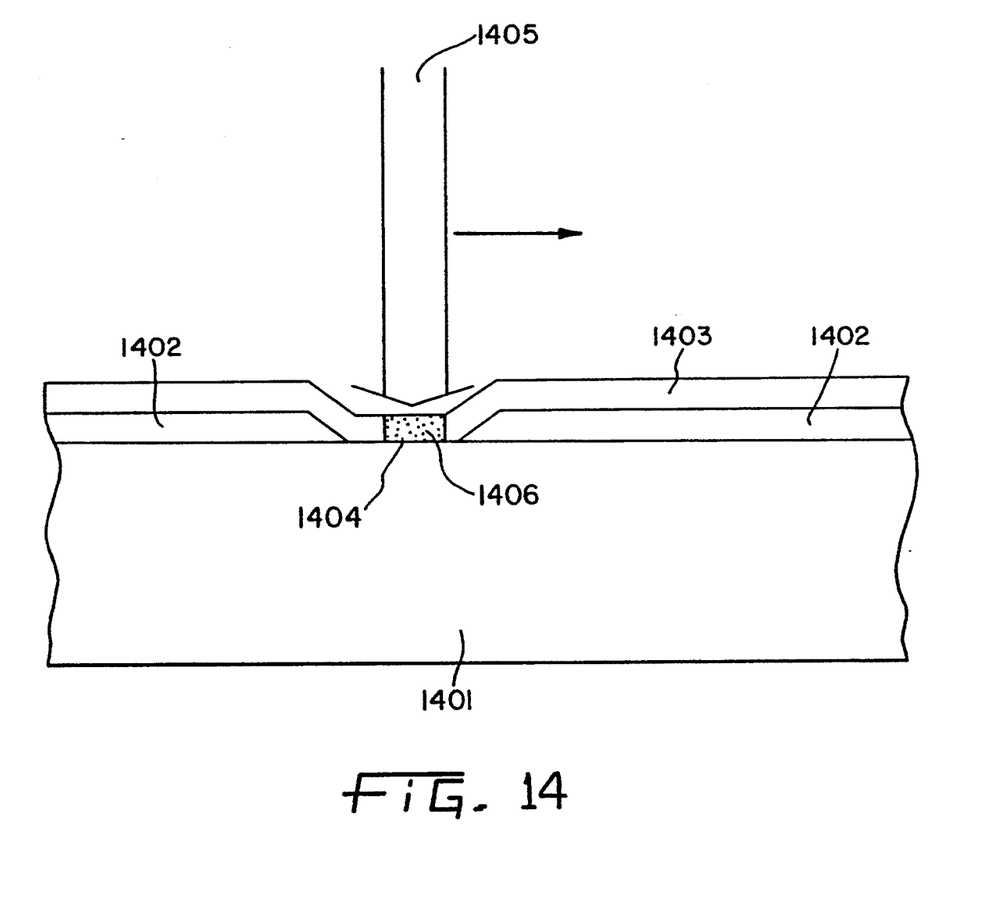
FIG. 14 is a sectional view of the lateral epitaxy technique.

In addition to these methods to build up monocrystals by the grating pattern, there is a technique called lateral epitaxy as given in FIG. 14. By this method, amorphous Si layer 1403 is stacked on the substrate 1401 of $SiO_2$ film 1402, which is formed on the substrate 1401 of Si monocrystal. In this case, a part of it is brought into direct contact with the surface 1404 of the substrate 1401. Then, laser beam 1405 is irradiated to form the melted region 1406 of silicon, and this is scanned with laser beam on the wafer. In this case, if laser beam scanning is started from the monocrystal portion 1404, the monocrystal growth is started from this portion and extends to $SiO_2$ film 1402, and the monocrystal layer is formed on the insulating film. In this case, too, crystal defects occur as the beam goes away from the monocrystal region, and it is not yet possible to form monocrystal silicon thin film of high quality all over the wafer surface. The method to heat locally by laser beam is also not very recommendable because extensive thermal distortion occurs on the substrate. For this method, it is essential to have monocrystal substrate of silicon because an insulator substrate is used, which is obtained by thermal oxidation of silicon substrate and by forming $SiO_2$ film on it. It is not possible to apply it for the formation of monocrystal thin film on a glass substrate with large area, as often seen in the manufacture of flat panel display unit.

As described above, there are a number of problems in SOI technique at present. These problems may be summarized as follows:

First, the temperature of wafer is increased partially to more than the melting point of silicon, 1412° C., because Si is partially melted for recrystallization. This is essentially incompatible with the semiconductor device process in future, which is primarily oriented toward low temperature. Specifically, various elements of IC such as wiring, formed before recrystallization, may be subjected to undesirable reaction by heat during the recrystallization process, or the characteristics may be extremely deteriorated by extensive thermal strain.

Secondly, in case where sapphire substrate or the silicon substrate produced by thermal oxidation is used, the application to a large-size display unit is generally impossible. It is difficult to prepare the substrate of good quality having large area, and there is also the problem of the cost increase.

Thirdly, except SOS technique, the crystal defects or the contamination by impurities often occur in the crystal layer obtained by various methods in SOI technique, and it is not yet on the level to produce ICs. For the practical application of SOI technique, it is necessary to develop the technique, by which it is possible to form the monocrystal silicon layer of high quality on any of insulator substrate through simple process and at low temperature.

To solve these problems, the present invention offers a method to manufacture the semiconductor device, which can form the high-quality monocrystal semiconductor layer on any of the insulator substrate at low temperature and through simple process.

The first point of this invention is to offer a method to manufacture a semiconductor device, which comprises at least a process to form an electrically conductive layer having graded steps, at least in a part of main surface of the substrate, and a process to form semiconductor thin film on said substrate with DC potential on said conductive layer.

The second point of this invention is to offer a method to manufacture a semiconductor device of the first point, wherein the main surface of the substrate is formed with the insulating material.

The third point of this invention is to offer a method to manufacture a semiconductor device of the first point, wherein main surface of the substrate is formed with the electrically conductive substance.

The fourth point of this invention is to offer a method to manufacture a semiconductor device of one of the first to the third points, wherein thin film is formed by the sputtering using inert gas when semiconductor thin film is formed.

The fifth point of this invention is to offer a method to manufacture a semiconductor equipment of one of the first to the fourth points, wherein the lateral side of the graded steps of the conductive layer is formed in such manner that the surface of the lower step of said graded step portion is surrounded by closed loop.

Operation

The main feature of this invention is that it contains at least partially a process to form the conductive layer having the form of graded steps at least in a part of main surface of the substrate and a process to form semiconductor thin film on said substrate with DC potential on said conductive layer.

Figure 11A:
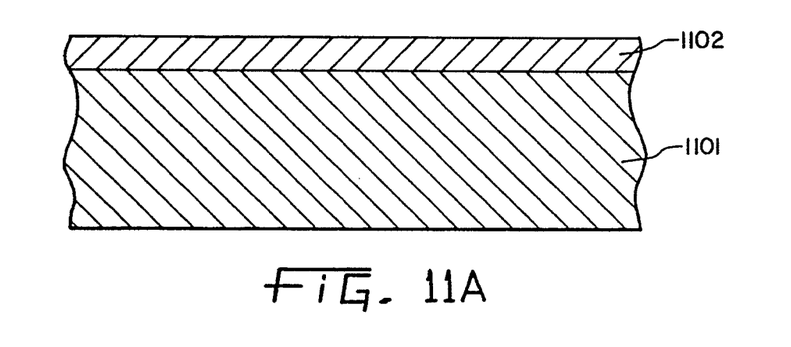

In this invention, the insulating substrate such as quartz substrate or glass substrate is used as the substrate. In addition, an AlN substrate 1101 with the film of silicon nitride, SiO2, etc. 1102 stacked on it as shown in FIG. 11 may be used as substrate. Such substrate has high thermal conductivity, and the heat generated from the device at high speed operation can be effectively released. Naturally, only A#N substrate 1101 may suffice. Further, the sapphire substrate as used in the conventional technique may suffice, whereas the most remarkable feature of the present invention is that the semiconductor monocrystal thin film of good quality can be formed on the substrate such as quartz substrate or glass substrate, which is available at low cost.

Figure 7A:
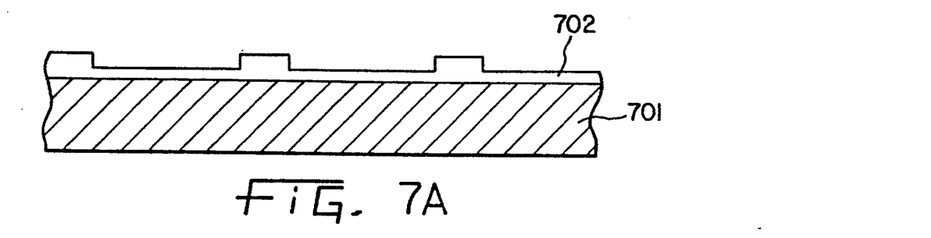
Figure 7B:
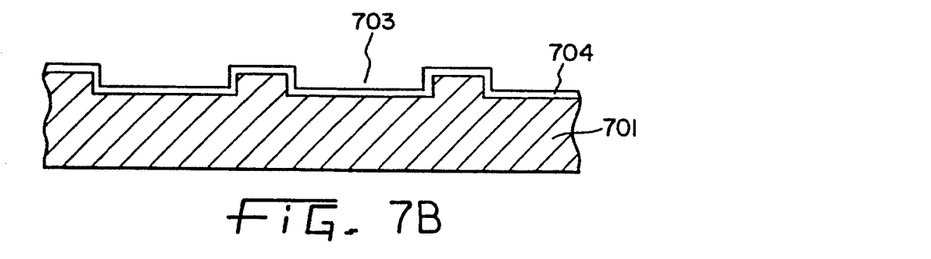
Figure 7C:
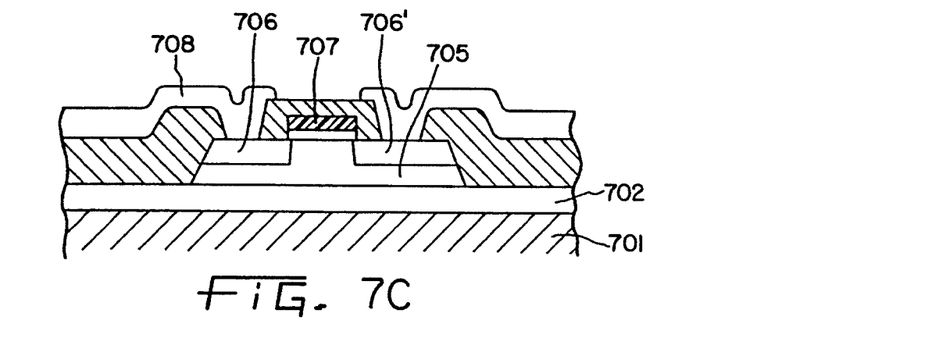

It is also possible to apply this invention to the electrically conductive substrate. For example, the insulating substrate 701 as shown in the section views of FIGS. 7 (a) and (b) furnished with metal thin film 702 having graded steps or the insulator substrate 701 with a recess 703 on its surface and furnished with metal thin film 704 all over the surface may be used. In other words, the semiconductor monocrystal thin film can be grown on metal thin film.

Figure 2A:
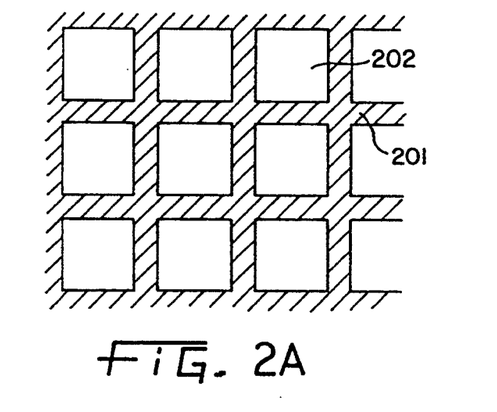
Figure 2B:
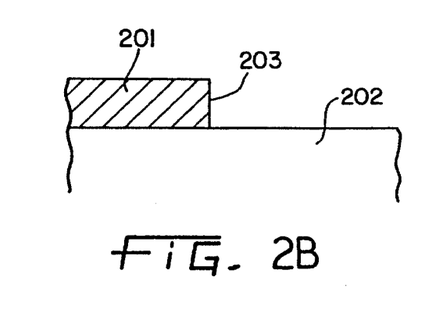

The electrically conductive layer with graded steps and formed on main surface of the substrate is, for instance, the metal thin film pattern 201 as shown in FIGS. 2 (a) and (b). FIG. 2 (a) is a plan where the portion with oblique lines 201 is a metal thin-film pattern formed with square hole pattern. As shown in the sectional view of FIG. 2 (b), it is fabricated in such manner that the pattern end surface 203 is perpendicular to the substrate surface 202. Such fabrication can be performed by normal photolithography. On this conductive layer, the DC potential is applied when the semiconductor thin film is formed as described later, and the formation of semiconductor thin film is controlled by this.

Figure 6A:
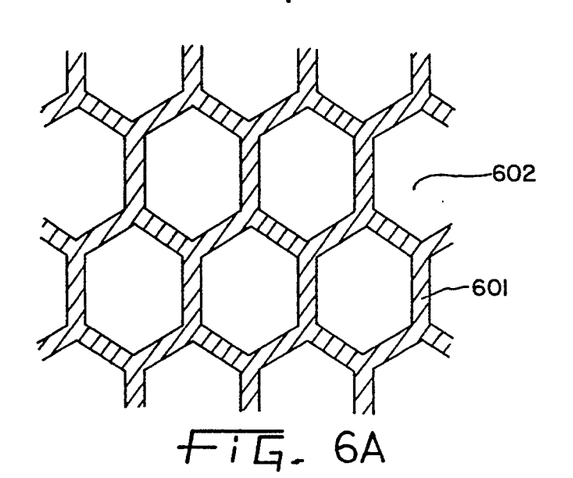
Figure 6B:
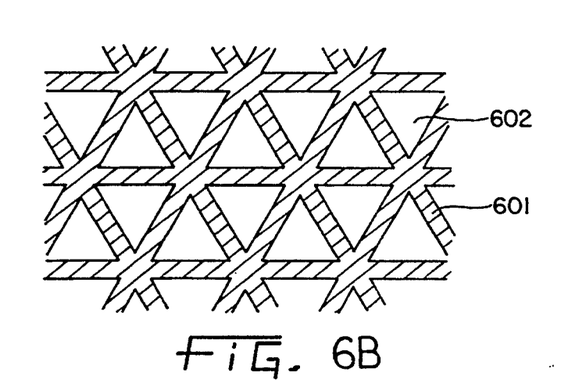

The size of the lattice pattern can be made as desired. Also, the shape of lattice pattern is not limited to the square hole pattern of FIGS. 2 (a) and (b), but it may be rectangular, regular hexagonal or regular triangular hole pattern as given in FIG. 6 (b). In FIGS. 6 (a) and (b), 601 represents a metal thin film pattern, and 602 is a substrate surface. However, the shape of this lattice pattern is closely related with the crystallizing direction of semiconductor thin film. For example, in the square hole pattern of FIGS. 2 (a) and (b), (100) face of Si can be formed on main surface of substrate, while (111) face of Si can be formed in regular hexagonal or regular triangular hole pattern of FIGS. 6 (a) and (b). This will be described in detail later.

As the material for the electrically conductive layer, W is considered as the most preferable, but it is not limited to this. For instance, it may be the other refractory metal or the refractory metal silicide. Naturally, it may be metal, such as Al, Cu, Ni, Pd, Pt, Au, etc., but it is necessary to decrease the heat treatment temperature in order to prevent the diffusion of these metals into substrate during the manufacturing process.

Next, description will be given on the process to form the semiconductor thin film with DC potential applied on the above conductive layer. For this purpose, the film formation by RF-DC bonding bias sputtering device by the present inventor (Japanese Provision Patent Publication Sho 62-287071) or the sputtering film formation with bias under high frequency application on quartz substrate holder may be applied.

By this invention, the semiconductor thin film is controlled by the conductive layer having graded steps and by DC potential applied during the formation of semiconductor thin film, and it is possible to obtain semiconductor monocrystal thin-film of good quality.

Next description will be given on the mechanism to form semiconductor monocrystal thin film on the surface of the substrate by the process of this invention.

Figure 3:
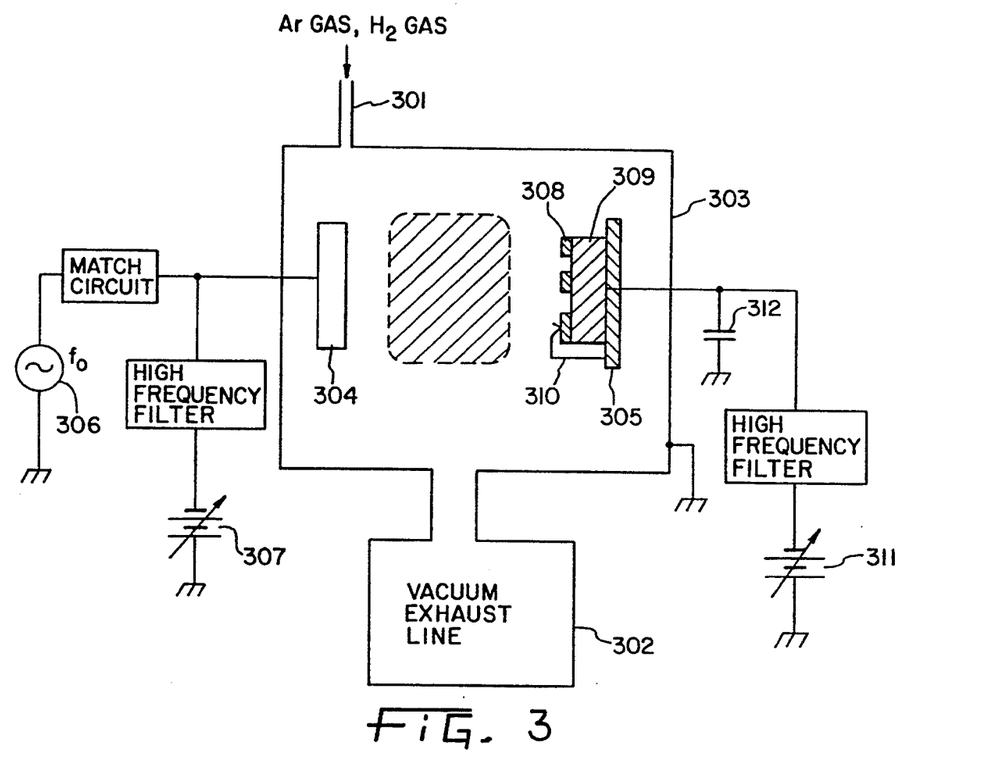
FIG. 3 is a schematic view of an RF-DC bonding bias sputtering unit, FIGS. 4 (a)-(c) are model drawings showing the mechanism of crystal growth, FIGS. 5 (a) and (b) are the schematical views of the other examples showing the configuration of the portion around high frequency power source of RF-DC bonding bias sputtering unit, FIGS. 6 (a) and (b) are plans to show the other examples of W thin film pattern of Embodiment 1, FIGS. 7 (a)-(d) are the sectional views of the processes for Embodiment 2 to 5, FIGS. 8 (a) and (b) are the sectional views for Embodiments 6 and 7, FIGS. 9 (a)-(g) are the plans and the sectional views showing the process and the composition of Embodiment 7.

To explain the method to apply DC potential, RF-DC bonding bias sputtering device (Japanese Provisional Patent Application Sho 62-287071) as shown in FIG. 3 will be described as a preferable example. This device consists of a vacuum chamber 303 furnished with a gas supply system 301 to supply ultra-high purity Ar gas and $H_2$ gas and with an ultra-high vacuum exhaust system 302, and a target 304 and a wafer holder 305 are installed in this chamber. In this case, the silicon block added with a fixed quantity of impurities such as As, P, B, etc. is used as the target 304, and the high frequency power source 306 of 100 MHz is connected from outside. Also, DC power source 307 is connected to the target through a high frequency filter (low pass filter). The quartz substrate 309 with W thin film pattern 308 is fixed on the wafer holder 305 and is electrically connected with W thin film pattern 308 through the pin 310. Therefore, the potential of W thin film pattern is controlled by DC power source 311 connected through high frequency filter from outside.

This device is characterized in that the important parameters for thin film formation such as the quantity of Ar ions irradiated on thin film surface during growth, kinetic energy of individual ions, etc. are freely and independently controlled together with the film forming speed of thin film. Specifically, the density of plasma, i.e the concentration of generated Ar ions can be determined by power of high frequency source 306. On the other hand, the sputtering field of the target can be determined by DC potential of the target. Film forming speed is determined by the combination of this high frequency power and DC bias value of the target. This is because kinetic energy of the ions irradiated on the target and the quantity of ions can be independently controlled. By controlling DC potential of wafer holder, the energy of Ar ions irradiated on Si thin film surface during growth is determined, and the quantity of irradiated ions can be determined by controlling the high frequency power. By these functions, it is possible to control freely the crystallographic property of thin film stacked on the substrate 309.

In the following, description will be given on an example, in which semiconductor thin film is stacked on the substrate having the metal thin film pattern of FIG. 2 in the device of FIG. 3.

Figure 4A:
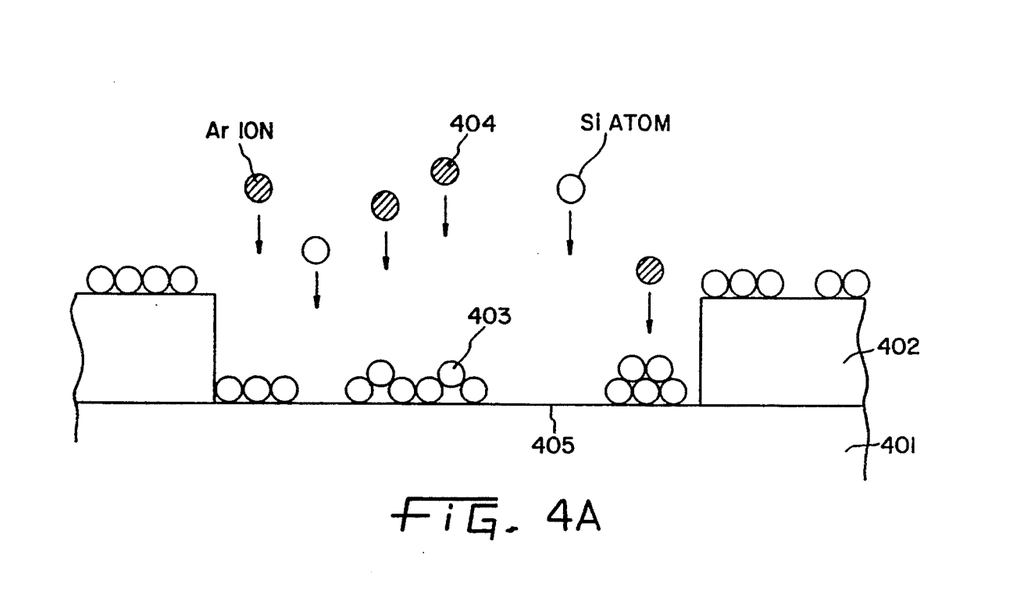
Figure 4B:
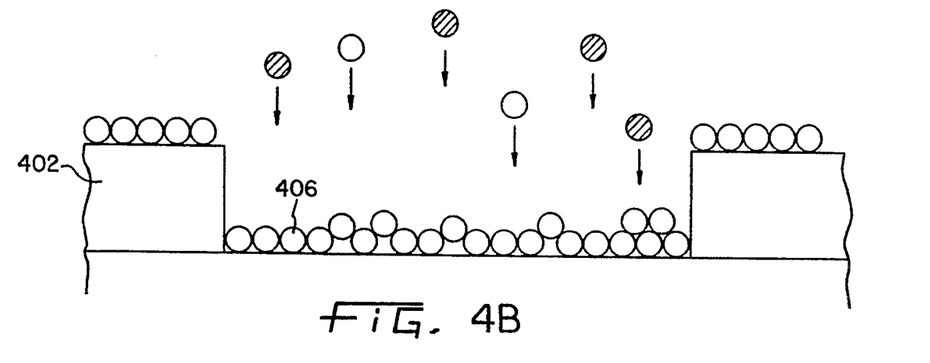

FIG. 4 (a) and (b) are the model drawings to explain the mechanism of crystal growth, where 401 refers to a quartz substrate, 402 a W metal thin film, 403 a Si atom, and 404 Ar ion. The conditions for stacking are: RF power 20 W, target bias $-300$ V wafer holder bias $-5$ V, and Ar gas pressure $8\times10^{-3}$ Torr. The results of the experiment reveal that the floating potential of the surface of the insulator substrate 401 is about OV and the potential of the plasma is about $+20$ V under these conditions. The values of the potential are determined according to the characteristics of each individual device, the shape of the device, etc., and the setting condition shown here is only an example.

FIG. 4 (a) shows schematically the conditions of early stage when Si thin film is being formed. Before forming the film, RF power was set to about 5 W, the target potential to about $-20$ to 30 V, the wafer potential to 5–10 V, and Ar ions and H ions were irradiated on the surface of the plasma, and the absorbed moisture and carbon were removed. Si atoms sputtered at the target reach the substrate surface 405, attach and stack there. Naturally, they also attach and stack on W thin film 402. At the same time, Ar ions also come to the substrate surface and irradiate the surface of substrate or the stacked Si surface. The irradiation energy of Ar ions are equal to the potential difference between plasma and substrate surface, and it is about 20 eV in this case. By this energy, nuclear generation on substrate surface and Si atom migration are activated, and the growth of Si crystals is accelerated. In the earlier stage of Si thin film formation, the crystal grains having various orientations grow in small isles as shown in FIG. 4 (a).

FIG. 4 (b) shows the conditions, in which the crystal grains thus grown are formed in continuous film all over the surface of the substrate surrounded by W thin film pattern 402. Under such conditions, Si thin film 406 is electrically connected with W thin film 402, and the potential becomes equal to the bias potential $-5$ V of wafer holder. Accordingly, Si thin film is irradiated by Ar ions with energy of about 25 eV from this moment. By the irradiation of Ar ions with this energy, the bonding between Si atoms all over the stacked Si thin film ceases to exist, and each of Si atoms can freely move.

Figure 4C:
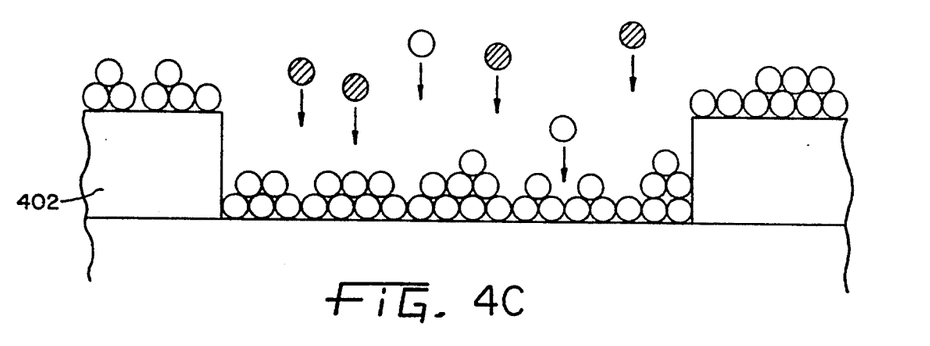

Further, when Si atoms move about and film thickness of thin film increases, kinetic energy of Ar ions given to Si atom layer at the lowermost layer is gradually decreased, and crystallization begins sequentially from silicon atom layer of the lowermost layer. If the patterns as shown in FIGS. 2 (a) and (b) are used, for example, (100) face of Si grows. This may be because re-arrangement occurs in order to minimize free energy of the entire film in contrast to the macroscopic shape of W thin film 402. This is schematically illustrated in FIG. 4 (c).

The thickness of Si thin film increases thereafter as time elapses. In the layer of several atoms at the uppermost layer, the very active condition, i.e. the condition with the free movement of atoms, is maintained, and the crystallization proceeds sequentially from the lower layers. It is not certain how many of Si atom layers on the surface allow free movement of the atoms because it depends upon the growing speed of thin film, the irradiation quantity of Ar ions, irradiation energy, etc. Under the condition as described above, it is approximately several atom layers.

In this example, the potential of the surface 405 of quartz substrate 401 with insulating property was set to approximately OV. This is approximately equal to the DC potential of the chamber because the wafer holder was grounded in high frequency by the capacitor 312 in the device of FIG. 3 and the wafer potential was not vibrated with high frequency.

Figure 5A:
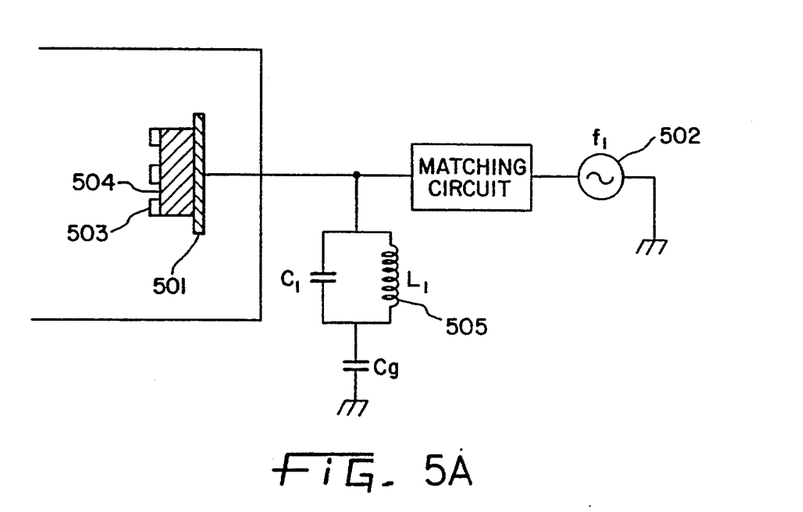

In this case, the high frequency source 502 may be connected to the wafer holder 501 as shown in FIG. 5 (a). Then, the same DC potential is given to W thin film 503 and the substrate surface 504. The value of this potential is determined by the frequency $f_1$ of high frequency and power, Ar gas pressure, etc., and it is possible to make it to the desired value by changing high frequency power.

The frequency $f_1$ of high frequency source applied on the wafer holder is different from the frequency $f_0$ of the high frequency source, which generates discharge within the chamber. Because the power is only to give DC potential, it is extremely low compared with the power $f_0$ to excite the discharge. 505 is a filter to show high impedance to the frequency $f_1$ and to show very low impedance to $f_0$. FIG. 5 (a) gives parallel circuits of L and C. The resonance frequency $(2n (L_1C_1)^{\frac{1}{2}})^{-1}$ is set to the equal value of $f_1$. Cg is to cut off the wafer holder from grounding so that DC potential is generated on wafer holder, and Cg is set sufficiently big value so that $(2n f_0C_g)^{-1}$ and $(2n f_1C_g)^{-1}$ become sufficiently low. Of course, LC serial resonance circuit can be used effectively to attain the same purpose. In this case, the resonance frequency $(2N (LC)^{\frac{1}{2}})^{-1}$ is set to the equal value as $f_0$.

Figure 5B:
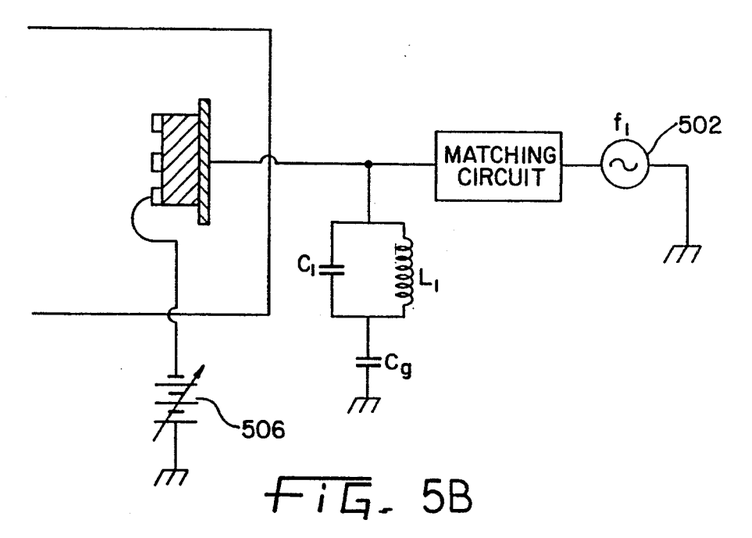

As explained in FIG. 3, if the potential of substrate surface and the potential of W thin film are to be set to different values and to be controlled, the composition of FIG. 5 (b) may be used. Then, the irradiation energy $E_1$ of Ar ions until Si thin film covers all surfaces of the substrate and the irradiation energy $E_2$ after such covering can be separately controlled by the power of external high frequency source 502 and the voltage of DC power source 506. The surface can be cleaned by Ar ion irradiation with lower energy by reducing $E_1$ sufficiently, and crystal growth can be achieved with optimal energy value $E_2$. On the contrary, it is also possible to activate the condition of substrate surface until the connecting film is formed by increasing $E_1$ and to automatically switch over to the optimal energy for recrystallization as soon as the connecting film is formed. If specific resistance of thin film crystal is high or the potential control of Si thin film cannot be achieved adequately due to reverse bias property of Schottky diode, it is preferable to follow the procedure of FIG. 5 (a).

It is desirable to set the frequency $f_1$ of high frequency source 502 to the value different from the frequency $f_0$ of the target high frequency source 306 (FIG. 3). For example, 205 MHz may be used.

Also, it is necessary to connect LC antiresonant circuit such as 505 in place of the capacitor 312 (FIG. 3). The resonance frequency of this circuit is equal to $f_1$, and it has infinite impedance to the high frequency of $f_1$. At the same time it is important to set the value of $C_1$ to such value that it may have sufficiently low impedance to the frequency $f_0$ of the high frequency source of the target.

In the above, description has been given on the case where the square pattern of FIG. 2 was used, but the pattern of the conductive layer such as FIGS. (a) and (b) may be used. The region surrounded by the conductive layer is regular hexagon in FIG. 6 (a), regular triangle in FIG. 6 (b), and both have triple symmetry. In case this pattern is used, the grown Si monocrystal layer has (111) orientation.

The selection of (100) or (111) orientation may be made according to the condition of each device, while the results of the experiments suggest that the film with (111) orientation has the better crystal property. Particularly, when the area of the portion surrounded by W thin film pattern is increased by more than 1 cm×1 cm or more, the difference becomes obvious. For example, the value of defect density is lower in the monocrystal of (111) face.

This may suggest the relation with the phenomenon that (111) face grows more easily if thin film is grown by irradiating with ions. The detailed mechanism of this phenomenon is not yet known, whereas it may be interpreted that Si thin film grows to such direction that the most dense face and the strongest to ion irradiation, i.e. Si (111) face is turned perpendicularly to the direction of ion irradiation. In other words, the monocrystal of (111) face grows because the ion irradiation itself has the property to align thin film to (111) orientation and the pattern of FIG. 6 plays a role in determining the orientation within the plane. Therefore, it is more natural to grow (111) Si rather than to grow (100) Si against the effect of this ion irradiation. Thus, the thin film with high crystal property is obtained.

As a result of this invention, the monocrystal semiconductor layer of high quality can be formed easily on any type of substrate through low temperature process. Thus, ultra-high speed semiconductor device, high-performance flat panel display unit, etc. can be manufactured.

BRIEF EXPLANATION OF THE DRAWINGS

FIGS. 1 (a)-(d) are sectional views of Embodiment 1, FIGS. 2 (a) and (b) are a plan and a sectional view of W thin film pattern of Embodiment 1 respectively.

FIGS. 12 to 14 represent the examples of the conventional method.

In the drawings, 101 refers to a quartz substrate, 101' a substrate surface, 102 a metal (W) thin film, 102' a W thin film pattern, 103 a Si monocrystal film, 104 a source drain unit, 105 a gate electrode, 106 and 106' Al wirings, 201 a W thin film pattern, 202 a substrate surface, 203 a pattern end, 301 a gas supply system, 302 an ultrahigh vacuum exhaust system, 303 a vacuum chamber, 304 a target, 305 a wafer holder, 306 a high frequency power source, 307 a DC power source, 308 a W thin film pattern, 309 a quartz substrate, 310 a pin, 311 a DC power source, 312 a capacitor, 401 a quartz substrate, 402 a metal (W) thin film, 403 Si atom, 404 Ar ion, 405 a substrate surface, 406 a Si thin film, 501 a wafer holder, 502 a high frequency power source, 503 a W thin film, 504 a substrate surface, 505 a filter, 506 a DC power source, 601 a W thin film pattern, 602 a substrate surface, 701 an insulator substrate, 702 a metal thin film, 703 a recess, 704 a metal thin film, 705 a monocrystal Si layer, 706 and 706' source drain unite, 707 a gate unit, 708 metal wiring, 709 an emitter, 710 a base, 711 a collector, 712 Al wiring, 801 an insulator substrate, 702 a metal thin film, 803 a SiO$_2$ film, 804 Si substrate, 805 a source unit, 806 a drain unit, 807 Al wiring, 808 an insulating layer, 809 a metal thin film layer, 901 a metal thin film, 902 Si thin film, 903 a source drawing wiring, 904 a gate drawing wiring, 905 a source drawing wiring, 906 a gate electrode, 907 a contact hole, 908 Al wiring, 1001 a glass substrate, 1002 a MOSFET, 1003 and 1004 metal electrodes, 1005 a transparent electrode, 1101 A#N substrate, 1102 SiN or SiO$_2$ film, 1103 an insulating substrate, 1104 a metal pattern, 1201 a SiO$_2$ substrate, 1202 amorphous Si, 1203 a melted region, 1301 a wafer, 1302 a stage, 1303 a carbon heater, 1304 a melted region, 1404 a Si monocrystal substrate, 1402 a SiO$_2$ film, 1403 amorphous Si layer, 1404 a substrate surface, 1405 laser beam, and 1406 a melted region.

In the following the embodiments of the invention will be described in connection with the drawings.

DETAILED DESCRIPTION OF PREFERRED EMBODIMENTS

Embodiments

The embodiments of this invention will be described in connection with the drawings.

Embodiment 1

Figure 1A:
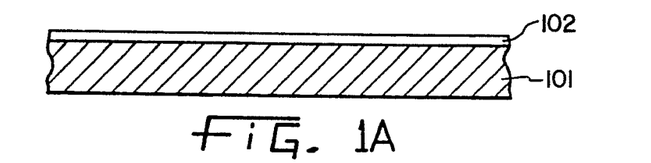
Figure 1B:
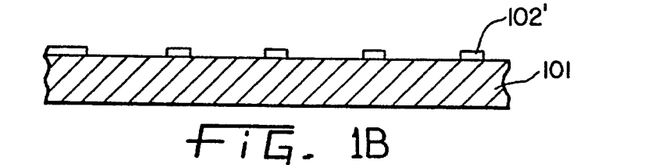

FIGS. 1(a)–(b) are the sectional views of the process to show Embodiment 1 of this invention. As shown in FIG. 1 (a), the metal thin film 102 of tungsten (W) is formed on the surface of quartz substrate 101 in thickness of about 500 A. To form this film, EB (electron beam) vacuum evaporation may be used. In order to obtain the metal thin film such as W with more dense and higher crystal property, it is more effective to perform the film formation by RF-DC bonding bias sputtering device (Japanese Provisional Patent Publication Sho 652-287071) by the present inventor or the sputtering film formation by applying bias under high frequency on quartz substrate holder by the above device.

Next, W thin film 102 is fabricated in the pattern of the desired shape by photolithography (FIG. 1 (b)). For planar shape of this pattern, W thin film having square hole pattern was arranged in lattice as in W thin film pattern 201 of FIG. 2 (a). In FIG. 2 (a), the portion marked with oblique lines is W thin film portion. As shown in FIG. 2 (b), it is preferable to fabricate in such manner that the pattern end surface 203 forms the steps approximately perpendicular to the substrate surface 202, Such fabrication can be performed by reactive ion etching (RIE).

Next, as shown in FIG. 1 (c), Si is stacked by about 0.1 to 0.5 μm by sputtering while DC potential is applied on W thin film. This was done by RF-DC bonding bias sputtering device (Japanese Provisional Patent Publication Sho 62-287071) as shown in FIG. 3.

Figure 1C:
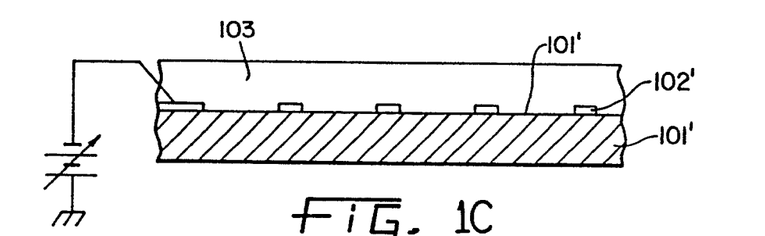

In this embodiment, the temperature of the substrate was set to 320° C., RF power to 20 W, target bias to −300 V, wafer holder bias to −5 V, and Ar gas pressure to $8 \times 10^{-3}$ Torr. Thus, Si monocrystal film 103 could be formed all over the surface portion 101' at the film forming speed of about 200 A/min (FIG. 1 (c)). It was found that Si monocrystal film 103 thus obtained has (100) face in parallel with the surface of substrate and that the crystals are aligned in (110) direction in parallel on one side of the square pattern (FIG. 2 (a)). This monocrystal thin film has almost no contamination due to crystal defect or impurities and was in very good condition.

Next, FIG. 1 (d) shows an example, in which MOSFET was formed in monocrystal silicon film 103 thus formed through normal process. FIG. 1 (d) is a schematic representation by enlarging the portion near W thin film pattern and shows the formation of an n-channel MOSFET. In FIG. 1 (d), 103 refers to a p-type monocrystal silicon layer, 104 a source drain unit, 105 a gate electrode, 106 and 106' Al wiring, 107 a field oxidation film, 101 a quartz substrate, and 102' a W thin film pattern.

Figure 1D:
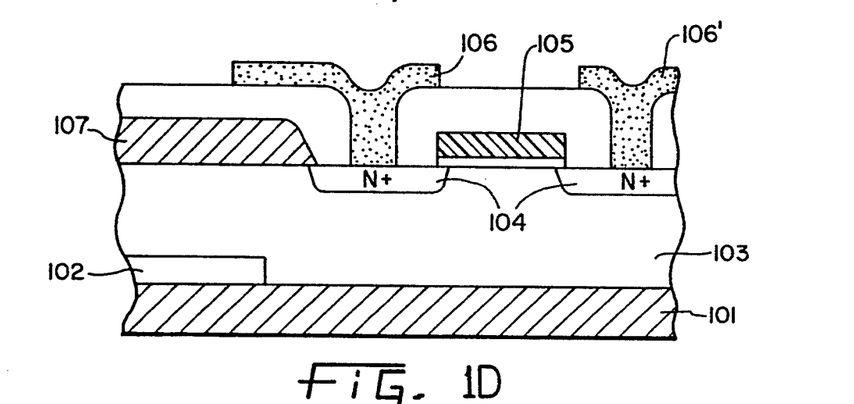

This W thin film pattern 102' is a pattern, which is needed only for the purpose of supplying DC potential and controlling crystal growth when monocrystal silicon is grown on the quartz substrate 101. For example, it may be removed together with silicon layer after monocrystal film 103 of FIG. 1 (c) has grown. Or, it may be left to the last moment as shown in FIG. 1 (d), and it may be used as an electrode for potential control of monocrystal film 103, which is a semiconductor layer of MOSFET.

The size of the lattice pattern shown in FIG. 2 (a) can be changed as desired. For example, the width of W thin film pattern 201 with W left was set to the square of the portion without W of the substrate surface 202 was set to 5 mm. In so doing, it is possible to use monocrystal region of 5 mm square as one chip, to prepare LSI circuit, and to use W thin film pattern 201 as the region for wafer dicing, i.e. as dicing line. Naturally, both the pattern width and the square pattern may be reduced or enlarged.

Here, the shape of the pattern and the sectional shape of the graded step is of primary importance. For example, square pattern is adopted as the shape of the pattern, and Si monocrystal of (100) face grows. The same applies to the rectangular pattern. Also, if the pattern such as FIG. 6 (a) or FIG. 6 (b) is used, (111) face grows. In FIGS. 6 (a) and (b), 601 is W thin film pattern, and 602 a substrate surface.

With regard to the sectional shape of the graded step, it is important that the graded step of the conductive material has the lateral side almost perpendicular to main surface of the substrate as shown in FIG. 2 (b). It is known that the shape of the step largely depends upon the crystal property of the monocrystal thin film thus formed. However, there is no need to be accurately perpendicular. It may be tapered in such manner that the angle of the lateral side measured from the substrate surface 2020, which is main plane of the substrate, is 90°±20° at maximum.

Although W was used as the conductive thin film in this embodiment, the material not limited to this. For example, the other refractory metal or refractory metal silicide may be used. Naturally, Al, Cu, Ni, Pd, Pt, Au, etc. may be used, but it is necessary to decrease the heat treatment temperature in order to prevent the diffusion of these metals into the substrate during the subsequent device manufacturing process. In case the refractory metal silicide is used, there is no problem such as the reaction between the conductive pattern 102' and Si monocrystal film 103 or the diffusion of metal atoms even when high temperature treatment of about 1000° C. is performed during the semiconductor device manufacturing process.

As described above, it is possible by the method of this invention to activate the surface of Si thin film by utilizing the impact of the particles having relatively low energy of about 20-30 eV and to obtain good Si monocrystal thin film through low temperature process for recrystallization of Si. That is, the temperature of the substrate during process is fixed to the temperature determined by the heating of the substrate. In Embodiment 1, the substrate temperature was set to 350° C., whereas this temperature may be lower or may be higher if necessary. In any case, because the recrystallization is performed at he temperature far lower than 1412° C., the melting point of Si, no thermal strain occurs, and there arise very few problems such as contamination. Accordingly, the thin film with excellent crystal property can be obtained. Also, there is no need to heat the base material to high temperature, and the method can be easily applied to 3-dimensional IC, which is formed by stacking the element in many layers. Further, it is not necessary to use expensive substrate such as sapphire, Si monocrystal substrate, etc., and the semiconductor monocrystal of good quality can be obtained with inexpensive substrate such as glass substrate. Also, the device of FIG. 3 can be produced in large size, and it is possible to produce high-performance large-size flat panel display unit by growing monocrystal silicon on the glass substrate of about 10 cm square and by combining with liquid crystal display.

As described above, Embodiment 1 of this invention has a number of excellent features compared with the conventional technique.

In Embodiment 1, the patterning of metal thin film was performed on the insulator substrate as shown in FIG. 1 (b), and the graded shape was formed by completely removing the metal thin film in the monocrystal silicon forming region. As it is evident from the description for FIGS. 4 (a) and (b), it is essentially important for obtaining semiconductor monocrystal of good quality to form the graded steps and to define the characteristics of thin film crystal.

Embodiment 2

FIG. 7 (a) is a sectional view of Embodiment 2 based on this invention. For example, after forming the metal thin film 702 of about 1000 Å on the insulator substrate 701 such as quartz, the graded shape of metal is obtained by the etching of about 600 Å using reactive ion etching with the resist as mask. It is also possible to grow monocrystal silicon layer through the same process as in FIG. 1 (c) for Embodiment 1 when the graded step as shown here is used. That is, monocrystal silicon layer can be grown on metal thin film. The others are the same as Embodiment 1.

Embodiment 3

FIG. 7 (b) is a sectional view of Embodiment 3 of this invention. A recess 703 is formed on the surface of the insulator substrate 701 by reactive ion etching, and the metal thin film 704 is formed all over the surface. It is possible to grow monocrystal silicon layer by the same procedure as described in FIG. 1 (c) for Embodiment 1, using the shape of the graded step as shown here. That is, monocrystal silicon layer can be grown on metal thin film. The others are the same as Embodiment 1.

Embodiment 4

FIG. 7 (c) is a sectional view of Embodiment 4 of this invention, in which MOSFET was prepared in monocrystal Si layer 705 formed on the metal thin film 702. 706 and 706′ are the source drain units, 707 a gate unit, and 708 metal wiring. The metal thin film 702 can be used for potential control of the MOSFET substrate. For example, it is possible to prevent the occurrence of abnormal electric current due to the floating effect of the substrate, which often causes the troubles in case of SOI MOSFET.

Embodiment 5

FIG. 7 (d) is a sectional view of Embodiment 5 of this invention, in which bipolar transistor is manufactured in the monocrystal silicon layer 705 formed on the metal thin film 702. 709 refers to an emitter, 710 a base, 711 a collector, and 712 aluminum wiring. In this case, it is also effective to grow the high concentration region (e.g. n+ region) on metal thin film, which is to become the collector electrode, for 0.02 to 0.1 μm, and to grow the high resistance region (e.g. n− region) with the thickness as desired.

Figure 7D:
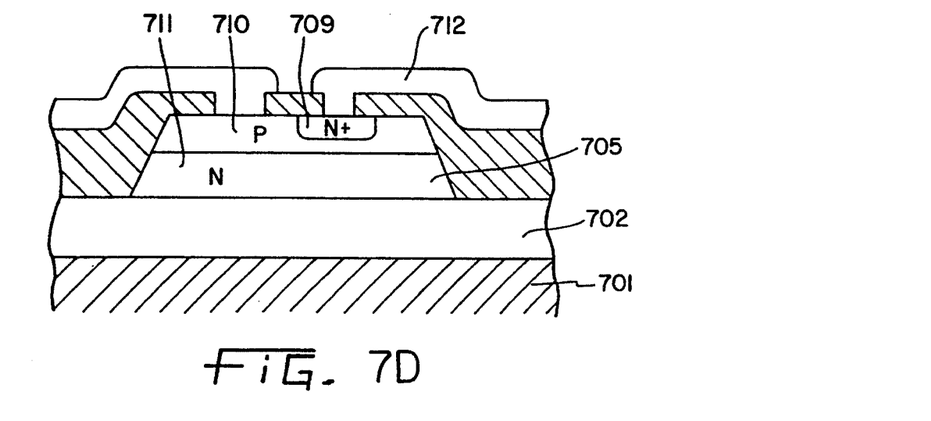

By the bipolar transistor prepared by the method of this invention, it is possible to produce the collector layer 711 thin enough and to take out the collector electrode directly to outside by the metal wiring 702. Thus, the serial resistance at the collector unit can be reduced to full extent.

Moreover, the film such as n+, n−, p+, p−, etc. can be grown at the temperature as low as 300 to 320° C. Accordingly, no trouble due to the distribution of impurities occurs, and it is the most suitable for ultra-high speed bipolar LSI. At the same time, when metal is used as 701 instead of insulator, the serial resistance of the collector extremely decreases, and thermal resistance is also reduced. Thus, it is possible to extensively improve the characteristics of high frequency power transistor or the transistor of micro-wave and milli-wave.

Embodiment 6

Figure 8A:
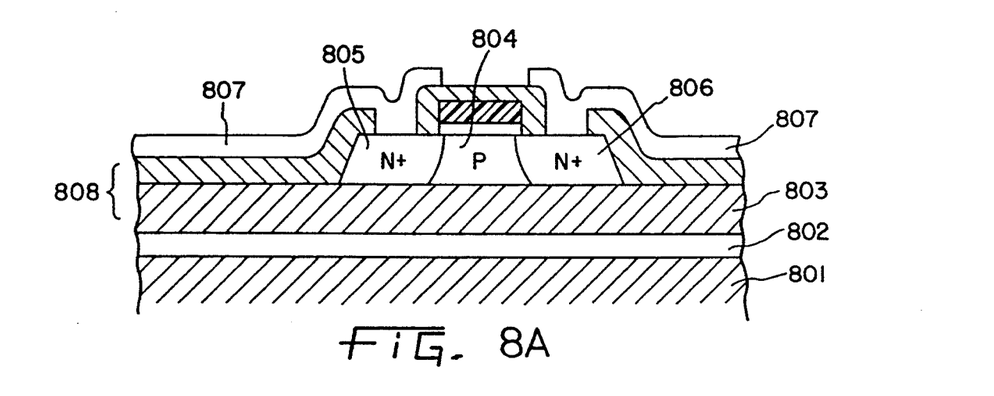

FIG. 8 (a) is a sectional view of MOS transistor, which is Embodiment 6 of this invention. The metal thin film 802 of about 0.5 μm is furnished on the substrate 801 of the insulator, and $SiO_2$ film 803 is formed on it by 2-frequency excitation bias sputtering. Then, monocrystal silicon layer is formed by the method of this invention, and MOSFET is formed on it. The MOSFET with Si substrate 804 completely floated is called the "current overshoot transistor". In contrast to the gate input pulse, which rises up with high speed, pn Junction between the source unit 805 and Si substrate 804 is momentarily biased forward, and a large quantity of electrons can be passed from the source unit 805 to the drain unit 806. This is a switching element with lower power consumption and capable to operate at the speed as high as that of bipolar transistor. The only wiring structure capable to propagate ultra-high speed signal to drive such transistor and to minimize crosstalk is the so-called metal-on-metal (M-O-M) structure as shown in the same figure, in which the metal wiring runs over the metal electrode 802 through the insulating layer. Thus, the present invention has offered for the first time a device, which can cope with ultra-high speed operation in both device and wiring structure.

Embodiment 7

Figure 8B:
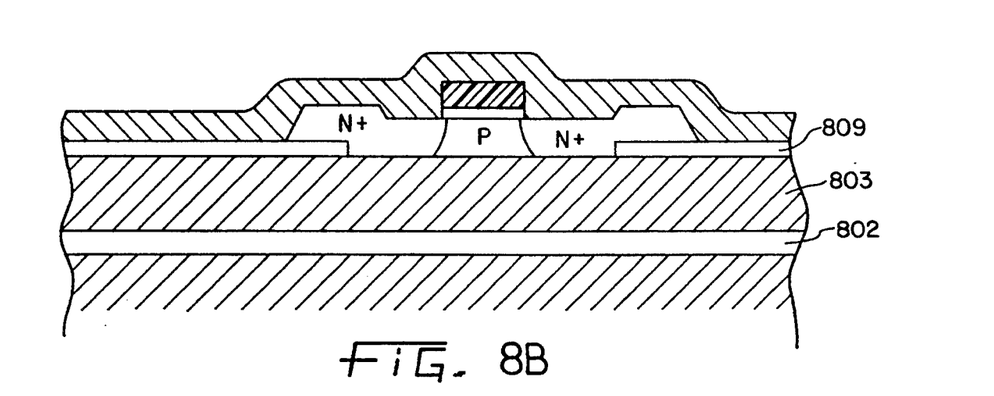

FIG. 8 (b) is a sectional view showing the structure of Embodiment 7 of this invention, in which the current overshoot transistor and the wiring of MOM structure are actualized at the same time. In this case, the metal thin film layer 809 used for the preparation of monocrystal Si layer is used as a wiring electrode. FIG. 9 is a plan of a manufacturing process of the device of this structure As shown in FIG. 9 (a) the metal thin film 901 is furnished on the surface of the insulator substrate, and a rectangular opening is provided. Then, monocrystal Si layer is formed by the same process as in FIG. 1 (c), and Si thin film 902 is left only on the portion, which is turned to the transistor (FIG. 9 (b)). Then, only the drawing wiring patterns of source-gate-drain (903, 904 and 905 respectively) are left, and the remaining metal films are removed from etching (FIG. 9 (c)). Finally, after performing gate oxidation, the metal gate electrode 906 is formed (FIG. 9 (d)), and MOS transistor of FIG. 8 (b) is completed.

Figure 9A:
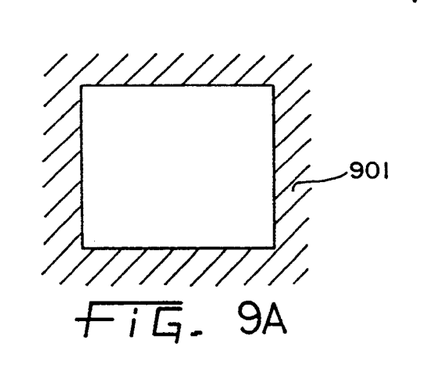
Figure 9B:
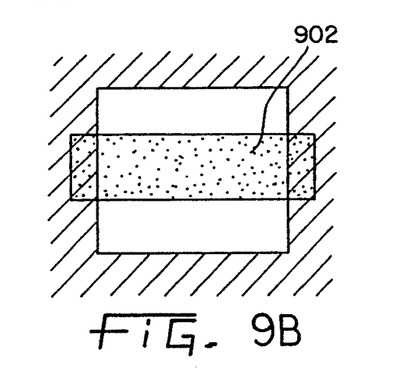
Figure 9C:
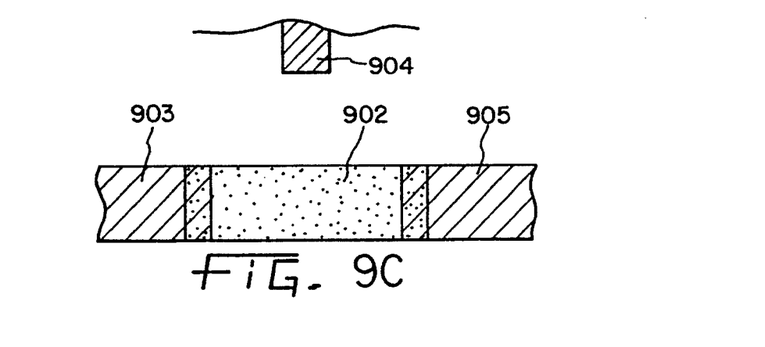
Figure 9D:
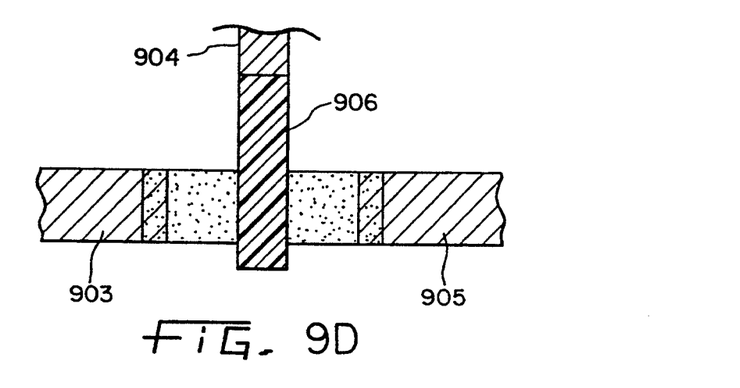
Figure 9E:
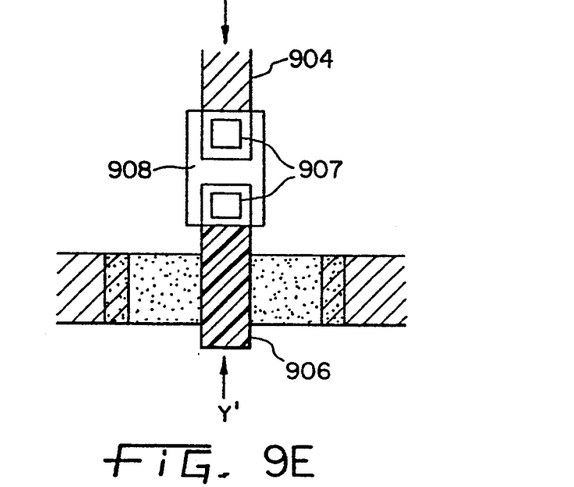
Figure 9F:
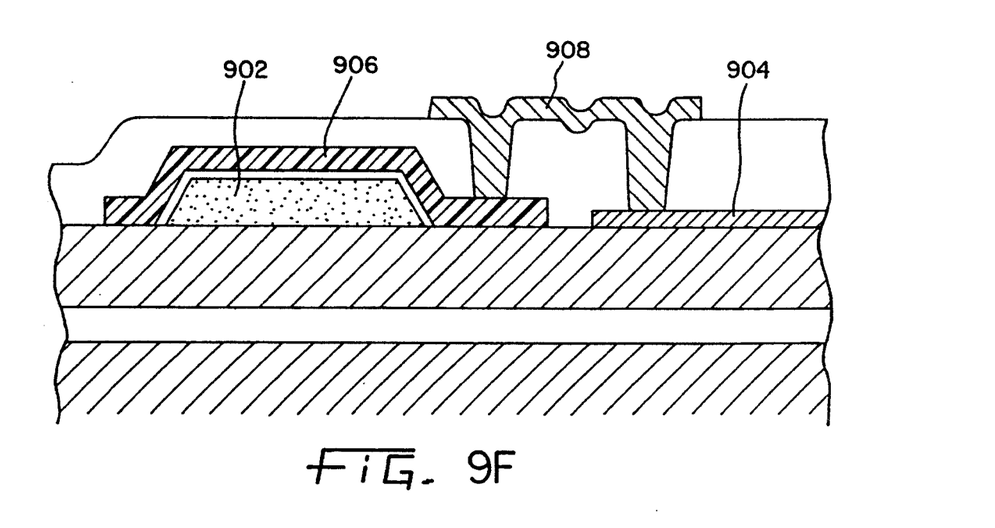
Figure 9G:
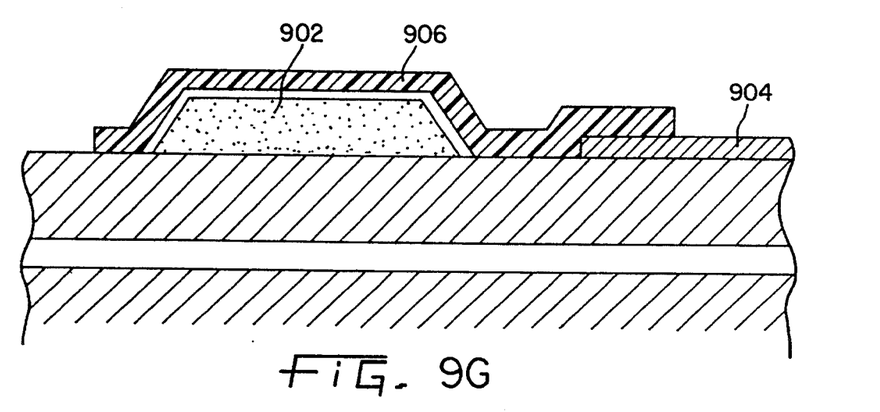

Poliside is used instead of metal electrode as the gate, and the gate electrode is not directly connected with the gate drawing wiring 904. After forming the insulating film all over the surface, for example, the gate electrode and the gate drawing wiring 904 are connected by the wiring 908 through the contact hole 907 (FIG. 9 (e)). The sectional view at Y - Y′ of this structure is given in FIG. 9 (f). FIG. 9 (g) is an example of the direct connection of gate electrode 906 with the gate drawing wiring 904.

Embodiment 9

Figure 10:
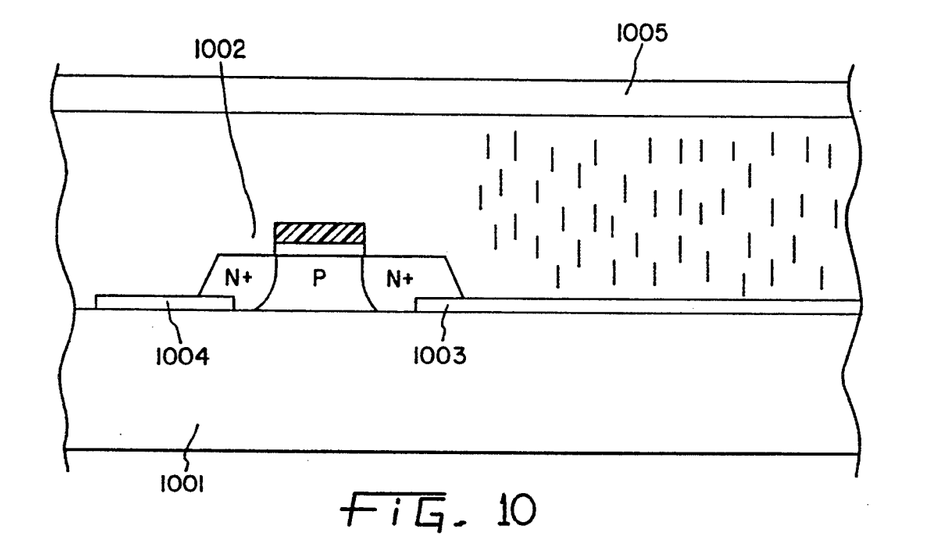
FIG. 10 is a sectional view of Embodiment 8, and FIGS. 11 (a)-(b) are a section view and a perspective view of the other example of the substrate and the metal pattern used in this invention.

FIG. 10 is a sectional view of the device showing Embodiment 8 of this invention, and this shows MOSFET 1002 formed on a glass substrate 1001 and the metal electrodes 1003 and 1004. When the transistor 1002 is turned on, the signal of the metal electrode 1004 is transmitted to the metal electrode 1003, and voltage is applied between this and the upper transparent electrode 1005. The orientation of liquid crystal between them may change, or the signal is converted to optical information by dynamic scattering. That is, this is a display cell of the flat panel display. Unlike the conventional transistor made of amorphous silicon, this is made of monocrystal silicon and is capable to operate at high speed. Also, the reliability of the element could be extensively improved. This makes it possible, for example, to provide flat panel type display unit of very fine grade with the size of 30 cm×30 cm. In such device, the driving circuit can also be fabricated by monocrystal silicon formed on glass substrate.

In the above embodiments, description has been given on the formation of monocrystal thin film on quartz substrate or glass substrate, whereas the material is not limited to this. For example, the film 1102 as shown silicon nitride, SIO2, etc. stacked on AlN substrate 1101 as shown in FIG. 11 may be used as substrate. On such substrate, the heat generated from the device on high speed operation can be released effectively because it has high heat transfer property. Naturally, only AlN substrate 1101 will suffice.

Figure 11B:
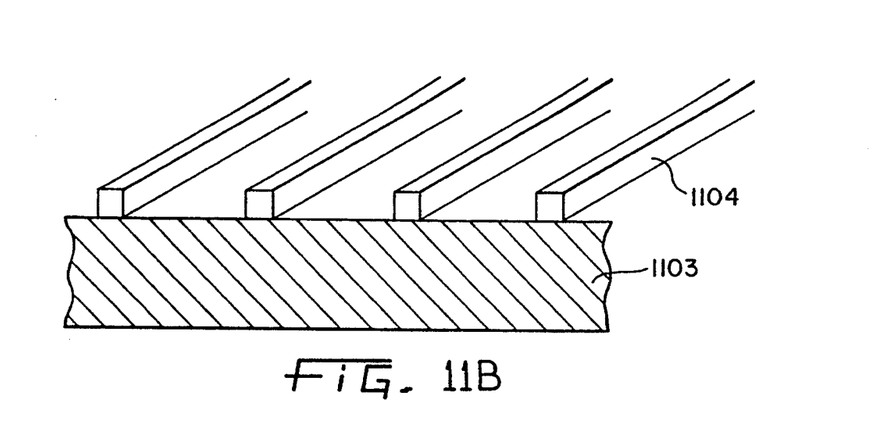

Further, description has been given only on the cases where rectangular, triangular or hexagonal patterns were shown as metal pattern, but the parallel grating pattern as shown in FIG. 11 (b) may be used. In FIG. 11 (b), 1101 represents an insulating substrate, and 1102 a metal pattern. Also, as semiconductor, description was given mostly on Si, whereas it is needless to say that semiconductor or superconducting material other than Si, e.g. Ge or other materials can be applied in the same way. Of course, the film forming conditions are determined separately according to each individual material or purpose.

As described above, it is possible by the method of this invention to activate the surface of semiconductor thin film by utilizing the impact of the particles having relatively low energy, to perform recrystallization of semiconductor and to obtain semiconductor monocrystal thin film of good quality through low temperature process. For example, the recrystallization of Si can be performed at the temperature far lower than the melting point of Si, 1412° C. Accordingly, thermal strain dose not occur, and the trouble such as contamination can be minimized. Thus, thin film with excellent crystal property can be obtained. Because the base material is not heated to high temperature, the method can be easily applied to 3-dimensional IC, which is formed by laminating the elements in many layers.

By selecting the pattern of the conductive layer having the graded steps into the desired shape, the plane orientation of the formed semiconductor monocrystal can be determined, and it is possible to control the property of the semiconductor thin film in positive and easy manner. This contributes to the higher reproducibility, when it is made in closed loop, it is possible to form the semiconductor thin film in blocks.

Further, there is no need to use expensive substrate such as sapphire or Si monocrystal substrate, and the semiconductor monocrystal thin film of good quality can be obtained using inexpensive substrate such as glass substrate. Because the semiconductor monocrystal thin film of good quality can be obtained using any type of the insulating substrate, remarkable effect can be obtained in low cost production.

Also, because large-size manufacturing equipment can be produced easily, it is possible, for example, to grow monocrystal silicon on a glass substrate of several tens of square centimeter or to produce a high-performance, large--size flat panel display unit easily and at low cost by combining with liquid crystal display.

On the semiconductor device such as the transistor manufactured by the method of this invention, ultrahigh processing speed or extensive improvement of the property can be actualized. For example, when bipolar transistor is manufactured by the method of this invention, very thin collector layer can be obtained. The collector electrode can be directly taken out from lower portion by the conductive layer, and serial resistance at the collector unit can be minimized. In addition, any type of film can be formed at low temperature, and the method is the most suitable for ultra-high speed bipolar LSI because no trouble occurs due to the distribution of the impurities. Particularly, when metal substrate is used, serial resistance of the collector is extremely decreased, and heat resistance is also reduced. Thus, the property as a high frequency power transistor or a transistor of micro-wave or milli-wave can be extensively improved.

Also, when MOSFET is manufactured, for example, the electrically conductive thin film used for the manufacture of semiconductor monocrystal thin film can be used as the electrode for potential control of substrate or for wiring. When the conductive thin film is used for the potential control of the substrate, abnormal current due to the floating effect of the substrate, as frequently seen with SOI MOSFET, can be prevented. When the conductive thin film is used as the wiring electrode, MOSFET can be obtained, in which the current overshoot transistor and the wiring of MOM structure can be actualized at the same time. This possesses two types of structure; the structure of a switching element capable to propagate ultra-high speed signals to drive the transistor at the speed as high as that of bipolar transistor and at low power consumption and the wiring structure to minimize crosstalk. The device to cope with ultra-high speed operation and having such element and the wiring structure is provided for the first time by this invention.

In summing up briefly, it is possible as the result of this invention to easily form monocrystal semiconductor layer of high quality on any type of insulating substrate through low temperature process and to actualize the manufacture of ultrahigh speed semiconductor device, high-performance flat panel display unit, etc. Accordingly, this invention provides a number of excellent effects compared with the conventional technique.

We claim:

1. A method of forming a monocrystalline film, comprising the steps of forming a conductor layer having a step portion on a surface of a substrate, said step portion including a lateral face, said lateral face of said step portion surrounding a lower surface of said step portion to form a closed loop, and thereafter forming a monocrystalline film on said lower surface while a DC potential is applied to said conductor layer, whereby the monocrystalline film is formed directly on said substrate.

2. The method of claim 1, wherein the surface of said substrate is made of an insulating material.

3. The method of claim 1, wherein the surface of said substrate is covered by a conductor.

4. The method of claim 1, wherein said film is formed by a sputtering method.

5. The method of claim 4, wherein said film is formed by applying a different potential between said substrate and said conductor layer.

6. The method of claim 1, wherein the shape of said closed loop is one of a triangle and hexagon.

7. The method of claim 11, wherein the shape of said closed loop is a rectangle.

8. The method of claim 1, wherein said step portion includes a pair of lateral faces that are parallel to each other.

9. The method of claim 1, wherein the step portion includes a lateral face, wherein the angle between said lateral face and said surface of said substrate is about $90°\pm20°$.

10. The method of claim 1, wherein said film is made of a semiconductor.

11. The method of claim 1, wherein said film is made of a superconductor.

* * * * *